(12) United States Patent
Münzer et al.

(10) Patent No.: US 7,129,109 B2
(45) Date of Patent: Oct. 31, 2006

(54) METHOD FOR STRUCTURING AN OXIDE LAYER APPLIED TO A SUBSTRATE MATERIAL

(75) Inventors: Adolf Münzer, Lohhof (DE); Reinhold Schlosser, München (DE)

(73) Assignee: Shell Solar GmbH, München (DE)

( * ) Notice: Subject to any disclaimer, the term of this patent is extended or adjusted under 35 U.S.C. 154(b) by 27 days.

(21) Appl. No.: 10/470,896

(22) PCT Filed: Feb. 1, 2002

(86) PCT No.: PCT/EP02/01096

§ 371 (c)(1),
(2), (4) Date: Nov. 18, 2003

(87) PCT Pub. No.: WO02/061854

PCT Pub. Date: Aug. 8, 2002

(65) Prior Publication Data

US 2004/0110393 A1 Jun. 10, 2004

(30) Foreign Application Priority Data

Feb. 2, 2001 (DE) ............................... 101 04 726

(51) Int. Cl.
*H01L 21/471* (2006.01)
(52) U.S. Cl. ........................................ 438/98; 438/694
(58) Field of Classification Search .................. 438/98, 438/694, 756, 920; 252/79.3; 136/256, 136/261
See application file for complete search history.

(56) References Cited

U.S. PATENT DOCUMENTS

| | | | |
|---|---|---|---|
| 2,127,781 A * | 8/1938 | McKay | 216/54 |
| 4,327,167 A | 4/1982 | Tanabe | |
| 4,348,255 A * | 9/1982 | Schmidt | 438/754 |
| 4,486,466 A | 12/1984 | Leech et al. | |
| 4,499,163 A | 2/1985 | Ishimaru et al. | |
| 4,504,607 A | 3/1985 | Leech | |
| 4,510,276 A | 4/1985 | Leech et al. | |
| 4,551,488 A | 11/1985 | Leech et al. | |
| 4,781,792 A * | 11/1988 | Hogan | 216/36 |
| 4,872,925 A * | 10/1989 | McMaster | 136/244 |
| 4,927,736 A | 5/1990 | Mueller et al. | |
| 5,281,350 A * | 1/1994 | Gimm et al. | 252/79.2 |
| 5,292,619 A | 3/1994 | Okinoshima et al. | |
| 5,454,861 A | 10/1995 | Hasegawa et al. | |
| 5,457,057 A * | 10/1995 | Nath et al. | 438/67 |
| 5,472,910 A | 12/1995 | Johnson et al. | |
| 5,667,596 A * | 9/1997 | Tsuzuki et al. | 136/256 |
| 5,688,366 A * | 11/1997 | Ichinose et al. | 438/754 |

(Continued)

FOREIGN PATENT DOCUMENTS

DE 4426347 2/1995

(Continued)

OTHER PUBLICATIONS

International Search Report dated Jan. 28, 2003.

*Primary Examiner*—Stephen W. Smoot
(74) *Attorney, Agent, or Firm*—McGlew & Tuttle, PC

(57) ABSTRACT

The invention relates to a method for structuring an oxide layer applied to a substrate material. The aim of he invention is to provide an inexpensive method for structuring such an oxide layer. To this end, a squeegee paste that contains an oxide-etching component is printed on the oxide layer through a pattern stencil after silk screen printing and the printed squeegee paste is removed after a determined dwelling time.

28 Claims, 8 Drawing Sheets

U.S. PATENT DOCUMENTS

Figure 1:
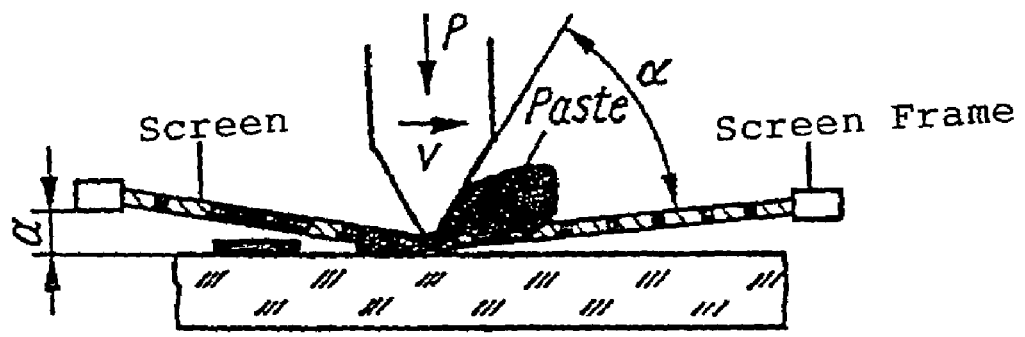

| | | | |
|---|---|---|---|
| 5,856,380 A * | 1/1999 | Bauer et al. | 523/300 |
| 5,894,853 A | 4/1999 | Fujisaki et al. | |
| 5,899,704 A | 5/1999 | Schlosser et al. | |
| 5,902,771 A * | 5/1999 | Slark et al. | 503/227 |
| 6,451,931 B1 * | 9/2002 | Ogawa et al. | 525/452 |
| 6,482,668 B1 * | 11/2002 | Okada et al. | 438/62 |

FOREIGN PATENT DOCUMENTS

| | | |
|---|---|---|
| DE | 19508712 | 9/1996 |
| EP | 0174555 A2 | 3/1986 |
| EP | 0713357 A1 | 5/1996 |
| EP | 0860742 A1 | 8/1998 |
| EP | 0891127 A2 | 1/1999 |
| JP | 62 009680 | 1/1987 |
| WO | 96/19012 A1 | 6/1996 |
| WO | 00/54341 | 9/2000 |

* cited by examiner

METHOD FOR STRUCTURING AN OXIDE LAYER APPLIED TO A SUBSTRATE MATERIAL

The invention concerns a method for structuring an oxide layer applied to a substrate material.

The problem with the structuring of oxide layers on a substrate material arises, for example, in the manufacture of solar cells. A crystalline silicon solar cell normally consists of a p-conducting substrate, into which a homogeneously thick layer of an n-conducting substance, such as phosphorus, is diffused on the front side. A metallic, conductive contacting material is applied to the front and rear side of the wafer in order to conduct the current produced as light falls on its surface. This contacting is normally applied using the screen printing technique in view of a cost-effective mass production.

The high degree of n-doping makes it necessary to harmonize two opposing constraints.

When using the screen printing technique for front-side contact, it is important to provide a sufficient degree of n-doping. If the degree of silicon doping is too low, the transition resistance between the silicon and the contacting is too high. This results in an increase in the series resistance of the solar cell, leading to a drop in the filling factor of the light characteristic of the cell. On the other hand, an excessive degree of n-doping leads to a reduction in the blue sensitivity of the solar cell, resulting in the premature recombination of charge carriers and thus a drop in efficiency.

In order to harmonize these two opposing constraints, it is proposed to use a so-called selective emitter structure for n-doping. This involves applying a high degree of n-doping to the very small area of the surface used for front-side contacting, while the other areas are subjected to a low degree of n-doping in order to ensure a high level of blue sensitivity.

Masking is required when integrating this selective emitter structure into the above-mentioned type of crystalline silicon solar cell. This masking can be provided, for example, by a structured oxide layer. This oxide layer must be produced in its own special process stage.

Known methods used for structuring this oxide layer are photolithography and laser. These methods are however relatively costly, and are thus not suitable for use in the production of low-cost solar cells.

An object of this invention is therefore to provide an inexpensive method for the structuring of an oxide layer on a substrate material. A particular objective of this invention is to provide an inexpensive method for manufacturing a solar cell with a selective emitter layer.

This task is fulfilled by the method described in patent claim 1 and the squeegee paste described in patent claim 19. Preferred applications of this method are as described in patent claims 5 and 9. Preferred applications of the squeegee paste are as described in patent claims 25, 26 and 27.

In the method described in this invention for structuring an oxide layer applied to a substrate material, a squeegee paste that contains an oxide-etching component is printed, according to the screen printing process, onto the oxide layer through a pattern stencil. The squeegee paste is removed again after a predetermined dwell time.

The invention thus uses a screen printing process that in itself is known, in order to structure the oxide layer on the substrate material. This involves adding an oxide-etching component to the squeegee paste. The oxide layer is etched in all areas of the surface that are printed with the paste, while the oxide layer in unprinted areas of the surface remains intact.

The etching process is terminated by washing the silicon wafer in water and/or a suitable solvent. This process uses only a screen printing apparatus, without the PhotoResist masks and corresponding process stages or costly laser devices that are otherwise used for structuring. The process can therefore be automated, making it suitable for the cost-efficient production of large batches on an industrial scale.

In a preferred embodiment, the oxide-etching component consists of hydrofluoric acid (HF) and/or ammonium fluoride ($NH_4F$) and/or ammonium hydrogen fluoride ($NH_4HF_2$). Hydrofluoric acid is an aqueous solution of hydrogen fluoride (HF). Common hydrofluoric acid, which contains around 40% HF by weight, dissolves quartz and silicates. Hydrofluoric acid (HF) and/or ammonium fluoride ($NH_4F$) and/or ammonium hydrogen fluoride ($NH_4HF_2$) can be used for the etching of glass and metals, and in particular for the etching of silicon oxide.

In a further preferred embodiment, the oxide-etching component may constitute a proportion of 10% to 20% by volume of the squeegee paste. It has been demonstrated that this proportion provides exceptionally good control of the dwell time. Depending on the thickness the oxide layer, dwell time can range from 30 seconds to 2 minutes.

A further solution provided by this invention lies in a method for the manufacture of a solar cell with a selective emitter layer on the light-facing side, comprising the following steps:
- to apply an oxide layer on a p-doped wafer,
- Structuring the oxide layer, using the screen printing process described above as part of the invention, with the application of a squeegee paste containing an oxide-etching component,
- to introduce a selective high degree of n-doping in the structured areas,
- to remove the oxide layer,
- to introduce a weak n-doping over the entire surface, over the selective high degree of n-doping, and
- contacting the light-facing side, using the screen printing process, in areas of the selective high degree of n-doping.

A preferred embodiment involves the application of n-doping by means of phosphorus-doping. The phosphorus glass ($POCl_3$) formed during the application of phosphorus doping is preferably removed in a subsequent etching process.

A further preferred embodiment specifies the contacting of the front side with a silver squeegee paste.

The front face of a solar cell produced industrially with the latest available technology is contacted using the screen printing technique.

In this case, the required thickness of the diffused n-layer is approx. 0.3 µm, with a phosphorus surface concentration of around $10E20$ atoms/$cm^3$. The depth and surface concentration of the n+-layer also determines the degree of sensitivity to the shortwave range of the solar spectrum. If blue sensitivity, i.e. the short-circuit current density, is to be further increased the penetration depth and surface concentration of the phosphorus in the n+-layer must be reduced. The result of this is that the contact resistance of the silvered surface and the n-doped silicon layer increases, leading in turn to a decrease in the filling factor of the light characteristic of the solar cell and thus to a drop in efficiency.

One way of ensuring low transition resistance between the silicon and the metal contacting, in the case of decreasing phosphorus surface concentration, lies in the use of intermediate layers made of metals with low barrier thresholds, such as nickel or titanium. However this involves a resort to other metal-coating technologies such as currentless metal precipitation or the vacuum metallizing process. These methods are however not suitable for use in mass production, and are in any case associated with high manufacturing costs.

The method suggested here for the manufacture of crystalline silicon solar cells with screen-printed contacts and increased blue sensitivity consists of a division of the n+-layer into two areas. One area, which corresponds to a large part of the surface of the wafer between the metallized areas, is subjected only to weak phosphorus doping in order to ensure a high degree of blue sensitivity.

The other area, confined to only a small part of the wafer surface under the metal coating, is subject to a higher degree of phosphorus doping in order to ensure reduced contact resistance. The use of a squeegee paste with an oxide-etching component also in this case permits the inexpensive manufacture of the selective emitter layer by simple structuring of the oxide layer.

A further problem arises with the contacting of the rear side of the solar cell. When the rear side of the solar cell is contacted by screen printing, the silicon must be contacted with the silver using a basic doping of around 1.5E16 atoms/cm$^3$. This is only possible with a high transition resistance, which has a strong negative effect on the filling factor of the solar cell. In order to reduce this transition resistance, the doping of the silicon on the back of the wafer must be raised to around 10E19 atoms/cm$^3$. Several methods are available for this purpose.

In the case of solar cells without back surface field (BSF), the doping on the rear side is produced by adding aluminium to the silver squeegee paste. Aluminium forms an alloy with silicon at temperatures as low as around 577° C. When the metal coating is burnt in, the aluminium constituent of the silver paste melts with the silicon as the temperature rises above 577° C. This molten mass crystallizes as it cools after burning-in, and the solidified silicon is doped with the aluminium to the point of solubility at around 10E19 atoms/cm$^3$. At this doping concentration, silicon can be contacted to silver with a low level of transition resistance.

Solar cells with back surface field (BSF) constitute a further class of cell. Whenever an attempt is made to reduce the thickness of silicon solar cells, a reduction in the efficiency of the cell can be observed. This is caused by the incomplete absorption of sunlight resulting from the reduced absorption length. More charge carriers are also produced in the vicinity of the rear side, as minority carriers may reach the rear electrode by diffusion and thus reduce the current produced by the majority carrier. A high degree of doping in the coating on the rear side permits the creation of a field—known as a back surface field (BSF)—which opposes the diffusion of the minority carrier. In the case of a solar-cell structure with a p-doped solar cell body and an n+-dope emitter on the light-facing side and/or the front side of the solar cell, further p+-doping is required on the rear side. The aluminium that is often suggested for this purpose is applied as a thin layer (e.g. by vacuum metallizing) to the rear side, and made to penetrate by means of a tempering or alloying procedure. It is also possible to produce p+-doping by applying back contacts containing aluminium and by the corresponding penetration of this aluminium. A further possibility is to diffuse aluminium from a solid diffusion source into the solar-cell substrate. This is however associated with the disadvantage that the solar-cell substrate is aluminium-doped on both sides, resulting in a p+pp+-structure.

Boron is also suitable for the production of p-doping. A corresponding back surface field can be produced in this way by the gas diffusion of a corresponding volatile or gaseous compound of boron, by the application of a silicon layer containing boron to the rear side, or by the application of a liquid solution containing the dopant. At the temperatures required for the penetration of the dopant, however, all-round diffusion—caused by the high degree of volatility of the boron compounds—is always observed. The masking of the areas of the solar cell that are not to be doped is designed to prevent this.

DE 33 40 874 C2 provides a known method for the production of a back surface field, which involves penetration of the semiconductor body with the corresponding dopant from a layer containing this agent.

The production of a back surface field by direct diffusion, or by penetration from a doping-agent layer, is known from U.S. Pat. No. 4,158,591. The section of the surface of the wafer that is not to be doped can be protected by covering it with a second wafer.

The demonstrably simple production of p+-doping with aluminium has the disadvantage of a high likelihood of corrosion. With time, areas of the layer that contain aluminium may decompose and become detached, which can result in damage to the rear-side contacts and a reduction in the performance of the solar cell. DE 195 08 712 C2 gives a known solution to this problem. The basic idea in this case is to produce p+-doping of the back surface field by expelling the boron from the diffusion source layer that contains it. Expulsion into an oxygenous atmosphere at high temperatures of 900° C. to 1200° C. prevents undesired doping of the edges and front side of the wafer.

Under these conditions, an oxide layer forms immediately on the edges and front side of the wafer, to mask the wafer and thus prevent any undesired doping of these areas. After penetration has taken place, both the oxide layer and the diffusion source layer can be removed using a simple etching process.

In a further solution proposed by this invention, this oxide layer, which is created in any case during production of the back surface field for the masking of the front side, is used during the production of a selective emitter layer.

Yet another feature of this invention is a method for the manufacture of a solar cell with a selective emitter layer on the light-facing side and a back surface field on the rear side. It comprises the following steps:

applying a diffusion source layer containing boron as a dopant to the rear side of a silicon wafer treating the wafer in an oxygen-containing atmosphere at a temperature of 900° C. to 1200° C. to create an oxide layer and drive-in the dopant, Structuring the oxide layer, using the screen printing process of the invention described above, with the application of a squeegee paste containing an oxide-etching component, introducting a selective high degree of n-doping in the structured areas, removing the diffusion source layer and the oxide layer, introducing a weak n-doping to the entire surface, depleting the n-doping at the edge of the wafer, contacting the light-facing side, using the screen printing process, in areas of the selective high degree of n-doping, and applying a back contact to the rear side.

The method for producing a BSF field known from DE 195 08 712 C2 can therefore be particularly advantageous, with respect to this invention, when combined with the structuring of an oxide layer, as the oxide layer used for masking is formed during penetration of the BSF doping, without a further process stage being required.

All the other advantages of the familiar process described in DE 195 08 712 remain intact.

It is possible to observe, for example, that the production of the back surface field (BSF) takes place before the creation of the semiconductor junction, and therefore before the diffusion of phosphorus onto the front side of the solar cell. The selected high temperatures ensures deep penetration of the boron doping.

This is then also stable with respect to all the subsequent stages in the manufacture of the solar cell, which are completed at considerably lower temperatures.

The creation of the junction by phosphorus diffusion supposes a further advantage. This can be carried out all around, i.e. on both sides and along the edges of the wafer. Phosphorus diffusion thus requires neither the masking nor covering of areas of the surface in order to eliminate the undesired doping of certain areas. The deeply penetrated BSF doping is only overcompensated by the phosphorus on the surface.

The material containing aluminium that is used to make the back contacts in turn enables—during the burning-in of the rear-side contact—contacting to the p+-layer, and thus compensate for the phosphorus-doped n-surface in the area of the rear-side contact. The rear-side contact can thereby be structured or applied to the entire surface.

The diffusion source layer contains boron, which is expelled by the application of heat. Application of the diffusion source layer should preferably take place with the help of a boron-dopant coating. Apart from boron or its compounds, this contains powdered $SiO_2$ in the form of slurry. This doped coating is normally used to produce increased doping in the case of power semiconductors. It can be applied as a liquid, by being spun on for example. A further possibility lies in the use of a boron doping paste, applied in a screen printing process. The use and application of doping pastes is described, for example, in WO 00/54341.

It is preferable to provide the rear side of the solar cell with a hydrophobic and therefore oxide-free surface. A thinnest possible layer of this doped coating is applied to this surface and then dried. This prevents the diffusion source layer from cracking or breaking up during penetration. A homogeneous and undamaged diffusion source layer ensures the consistent doping of the rear side.

The driving in of the boron from the diffusion source layer into the solar cell takes place at a temperature of 900° C. to 1200° C. and preferably at 1000° C. to 1100° C. This penetration temperature lies above that normally used for the penetration of solar cells.

The application of boron-dopant coating normally involves the coating of one side of the components or wafers, which are then stacked on top of each other so that there are alternate layers of surfaces to be doped and surfaces to be left untreated. This is intended to prevent the doping of these opposing surfaces, without any need for masking. However, this suggested method has the disadvantage that the components or wafers are baked together at the high temperatures required for penetration, and then have to be separated by mechanical or chemical means.

The method provided by this invention requires neither masking nor covering of the untreated surfaces by stacking. During driving in of the dopant, the solar cells (wafers) are arranged at spaced intervals to prevent them from becoming baked together.

An oxygen-containing atmosphere is required for driving in the dopant. An atmosphere of pure oxygen is preferred. In order to allow the oxide layer to form immediately, the solar cells are placed directly into a kiln that has been preheated to the penetration temperature. After the fast formation of the oxide, the oxygen atmosphere can be replaced with other gases, such as nitrogen.

A further advantage of this method is the high chemical affinity of an oxide layer with respect to boron, which is greater than that of silicon to boron. This results, during forming of the doping layer, in volatile boron escaping into the atmosphere being absorbed by the oxide layer, and only a small amount can then get into the surfaces that are to be excluded from boron doping.

After cooling, both the diffusion source layer and the oxide layer are removed with, for example, an HF dip.

The semiconductor junction required for the solar cell is produced by the diffusion of phosphorus. This can be carried out using all-round diffusion, which produces a flat n-doped layer area on the rear side in addition to the n-doped emitter layer on the front side. The phosphorus glass ($POCl_3$) produced during the application of phosphorus doping is preferably removed in a subsequent etching process.

As the phosphorus diffusion is carried out at around 800° C. to 900° C., which is a considerably lower temperature than that used in boron penetration, the p+doping on the rear side of the solar cell at 1 μm to 5 μm is maintained considerably deeper than the approximately 0.2 μm n-doping layer.

The n-doping on the edge of the solar cell must be depleted in order to ensure that the semiconductor component is fully functional.

This avoids short circuits and other negative effects on the performance of the solar cell. In order to deplete the n-doping, the solar cells can be stacked on top of each other and briefly subjected to the action of an etching plasma.

In order to obtain a fully functioning rear-side contact, the p+-layer on the rear side must be contacted through the n-layer. This is achieved using a rear-side contact containing about 1% to 3% by weight of aluminium. During the burning-in of the back contact, the aluminium penetrates the rear side of the solar cell, resulting in p+-doping, which overcompensates the n-doping beneath the back contact. This creates a low-ohmic connection area beneath the back contact, which ensures smooth conductance during operation of the solar cell.

The current-conducting contact on the front side (front-side contact) that is required for a fully functioning solar cell can be created in a known way before, during or along with the rear-side contact, or after burning in the rear-side contact.

A further solution provided by the invention consists of a squeegee paste that contains a binding agent and an oxide-etching component.

In a preferred embodiment, the squeegee paste possesses a viscosity of between 10 and 500 Pa-s, and preferably of between 50 and 200 Pa-s.

This viscosity is the material-dependent proportion of the frictional drag that opposes the movement of adjacent liquid layers during displacement. According to Newton, the cohesive resistance (transverse strain $t=\eta \cdot \partial u/\partial y$) in a liquid layer between two parallel surfaces moving relative to one another is proportional to the speed and/or shear rate $G=\partial u/\partial y$ ($\approx u/h$), with moving speed u and sliding surface clearance h.

The proportionality factor η is a material constant, described as dynamic viscosity. According to the definition equation, η has the dimension mPa·s. In the case of Newtonian or purely viscous liquids, η depends on pressure and temperature. The degree of dependence in this respect is determined by the composition of the material. Liquids or substances of non-homogeneous composition possess non-Newtonian or structurally viscose characteristics. The viscosity of these substances is additionally dependent on shear rate G.

A further preferred embodiment specifies a binding agent consisting of wallpaper paste. It has been demonstrated that wallpaper paste is a highly environment-friendly binding agent, with a viscosity that can be adjusted by the addition of water. Common types of wallpaper paste that can be used include Metylan® (supplied by Henkel). Hydrofluoric acid (HF) and/or ammonium fluoride ($NH_4F$) and/or ammonium hydrogen fluoride ($NH_4HF_2$) can be mixed into the wallpaper paste to act as an oxide-etching component.

The oxide-etching component should preferably be present in the squeegee paste with a proportion of 10%–20% by volume.

Another viable alternative is to use a binding agent made of, for example, an epoxy resin. Epoxy resins are widely used as binding agents for paints and coatings, and their use as binding agents for squeegee paste is also possible, as shown for example by U.S. Pat. No. 4,486,466. The publication of the document U.S. Pat. No. 4,486,466 is cited in this application with the corresponding reference. U.S. Pat. No. 4,486,466 cites an acid-resistant squeegee paste, for which the invention specifies the possibility of mixing in oxide-etching components such as hydrofluoric acid (HF) and/or ammonium fluoride ($NH_4F$) and/or ammonium hydrogen fluoride ($NH_4HF_2$). U.S. Pat. No. 4,486,466 also cites a series of modifiers that allow the characteristics of the squeegee paste to be controlled. In this way, flow accelerators prevent the formation of "fisheyes".

Screening accelerators provide an additive designed to make pressing easier. Gelling agents are used to adjust the viscosity of the squeegee paste to the desired level. U.S. Pat. No. 4,486,466 herein incorporated by reference describes a gel-like state that permits the flow of squeegee paste during completion of the screen printing process, and which—when at rest and not being subjected to external forces—results in the squeegee paste adopting a stable, non-flowing state.

Further published documents cited with reference to squeegee paste are: U.S. Pat. No. 4,327,167, U.S. Pat. No. 5,292,619, U.S. Pat. No. 5,454,861, U.S. Pat. No. 5,472,910, U.S. Pat. No. 4,271,258, U.S. Pat. No. 4,510,276, U.S. Pat. No. 4,504,607, U.S. Pat. No. 4,551,488, U.S. Pat. No. 4,499,163, U.S. Pat. No. 4,927,736, EP Publ. No. 0 891 127 A2, EP Publ. No. 0 860 742 A1, EP Publ. No. 0 713 357 A1, EP Publ. No. 0 174 555 A2 and International publication No. WO 96/19012 all of which herein incorporated by reference.

Preferred uses of the squeegee paste cited in the invention apply to: the method described above for the structuring of an oxide layer attached to a substrate material; the manufacture of a solar cell with a selective emitter layer on the light-facing side; and the production of a solar cell with a selective emitter layer on the light-facing side and a back-surface-field on the rear side.

The invention will be described hereinafter in more detail and by way of example, with reference to the accompanying drawings in which the examples should not be construed to limit the scope of the invention.

Figure 2:
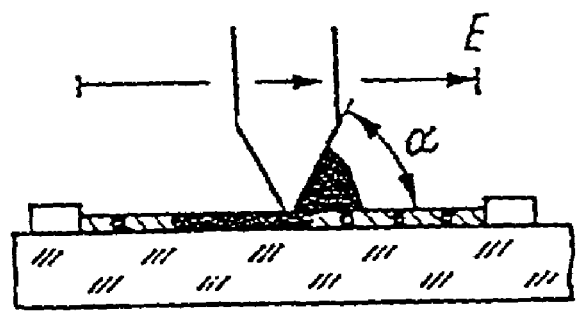
Figure 3:
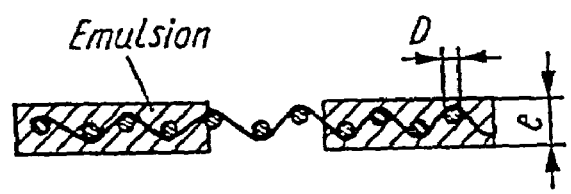
Figure 4:
Figure 5:
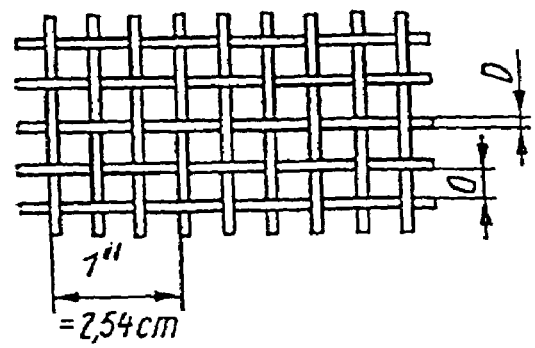
Figure 14:
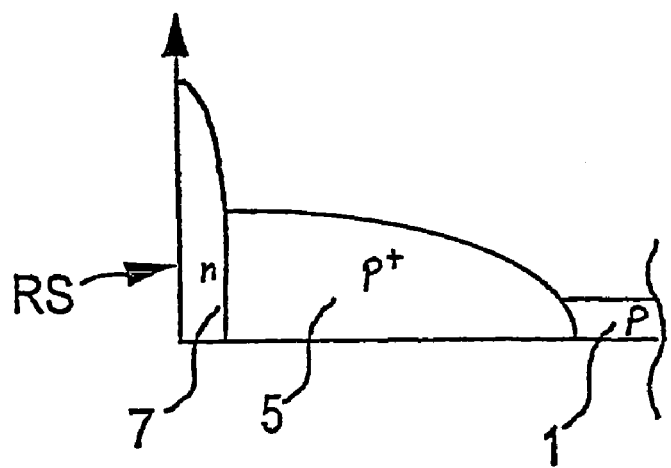
Figure 15:
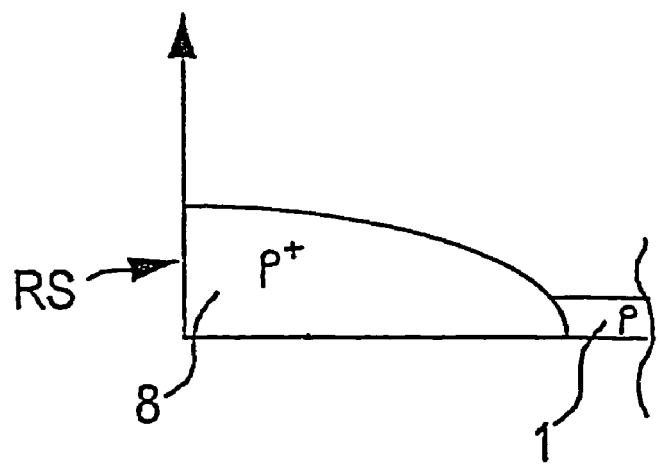
Figure 16:
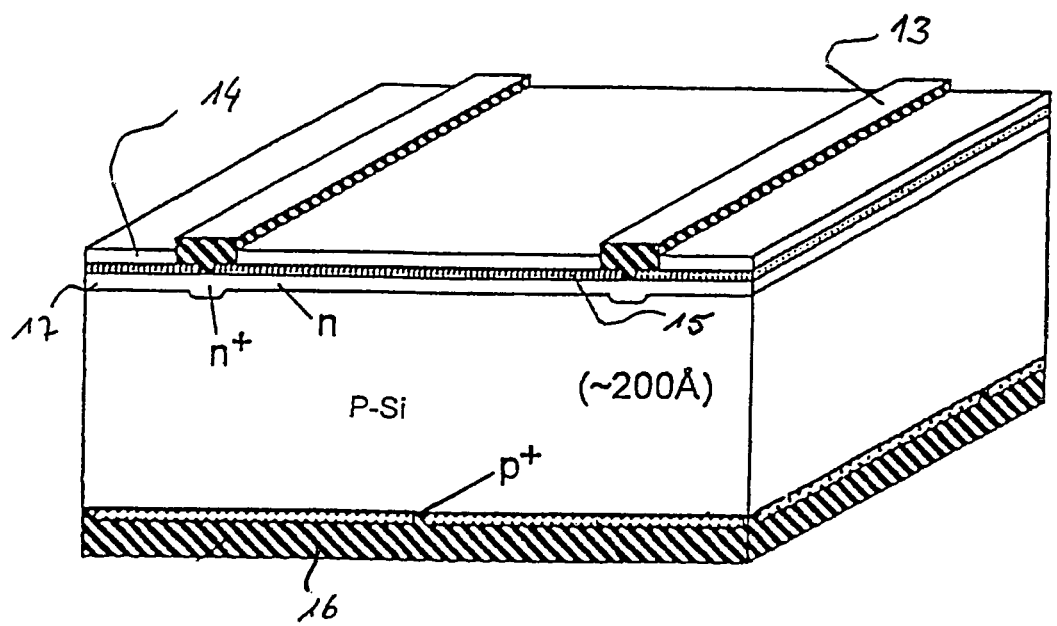

FIG. 1 The screen-printing process based on the take-off technique,

FIG. 2 The screen-printing process based on the contact-print technique,

FIG. 3 A cross-sectional view of a direct emulsion screen,

FIG. 4. A cross-sectional view of an indirect emulsion screen,

FIG. 5 An illustration of the parameters corresponding to a gauze screen,

FIGS. 6–11 Depiction of various stages in the process, using schematic cross-sectional views of a solar cell, FIGS. 12–15 Doping profiles of a solar cell, as produced on the front side (VS) and rear side (RS), and FIG. 16 A schematic cross-sectional view of a finished solar cell.

In screen-printing, semi-fluid pastes are printed onto a substrate material through a fine-mesh screen, which contains the pattern stencil (or etched metal screen). In the case of screen printing based on the thick-layer technique, there is an additional burning-in stage, for which electrical and mechanical characteristics are established (layer thicknesses of 10 μm to 25 μm for the dried layer). Burning-in does not take place in the screen printing technique of the present invention. Instead, the squeegee paste is removed again, after a pre-determined dwell time, with a suitable solvent.

The types of printing used are the take-off and contact techniques. FIG. 1 shows the screen-printing process based on the take-off technique. The take-off a of the screen normally comes to around 100 μm, with an adjustment angle of α between the edge of the squeegee, which pushes the squeegee paste across the screen, and the screen itself. The screen is held in place by a screen frame, while the squeegee is pushed across the screen at speed v and squeegee pressure P. This pushes the squeegee paste onto the screen. FIG. 2 shows the screen-printing process based on the contact-print technique. The screen lies on the substrate at this stage, and the squeegee is moved—with reduced pressure—across the screen. After the end of this movement E, the squeegee is lifted off the screen.

The screen is tensioned uniformly using a screen-tensioning device with a hydraulic/pneumatic clamping mechanism. Screen tension is checked by using a gauge to measure the defined amount of screen sag for a specific surface at a fixed weight. The use of special pneumatic/hydraulic printing machines allows squeegee pressure (P), printing speed (V), take-off (a) and the path of the squeegee (horizontal and vertical, adjustment angle) to be adjusted, with various degrees of automation, to the stages of trial production and full production.

The following describes the simple mixing of an etching paste based on common wallpaper paste (such as Metylan®, supplied by Henkel): 5 g of a common wallpaper paste in powder form are added to 150 ml of water and stirred. After about 30 minutes, a mixture of ammonium fluoride and hydrofluoric acid (5 g $NH_4F$+25 ml HF 40%) is stirred into this paste. After about an hour, this mixture is ready to use for etching. An etching paste of this type can be used, according to the screen printing process, for the selective removal of a thermal $SiO_2$ of about 100 mm in thickness within about one minute. Etching is terminated by immersing the Si wafer in water and then rinsing it thoroughly with a fine water spray.

The screens used in the screen printing process are normally made of plastic or steel-wire mesh, with the required thickness determined by the wire gauge and mesh width. These mesh screens are structured, either directly or indirectly, with photosensitive materials. FIG. 3 shows a cross-section of a direct emulsion screen, while FIG. 4 depicts the same view of an indirect emulsion screen.

Metal masks, with a hole structure that is produced either directly or indirectly, are used for printing extra-fine lines and to provide the high precision required for sequential printing.

FIG. 5 shows the parameters of a gauze screen with wire gauge D and mesh width o. The mesh-count functions as a screen parameter in the following way:

| Holes per inch, or | e.g. M250 = 250 mesh holes per inch T100 = 100 mesh holes per centimetre |
|---|---|

The printed layer has a thickness of approximately 0.5×D.

Figure 6:
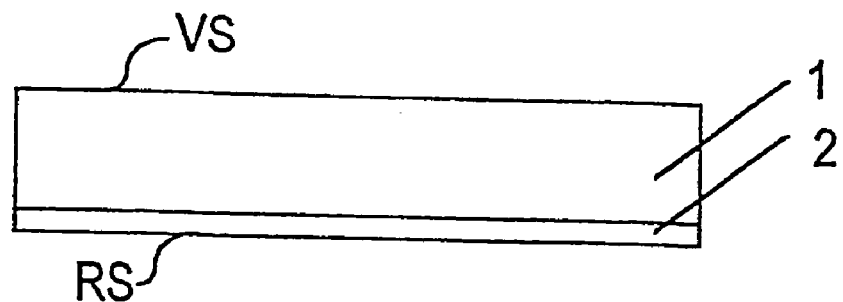

FIGS. 6–11 show various stages in the process, using schematic cross-sectional views of a solar cell, FIG. 6 shows the newly-made wafer 1 with a doping layer 2 applied. In this example, a wafer made of p-doped Cz-silicon with <100> orientation is selected for the solar cell. In this case, brief, basic, crystal-oriented etching of a texture is applied to the surface, which improves the geometry of the light-facing side and prevents reflections (not shown in FIG. 6). A thin doping layer 2 (e.g. Siodop®, supplied by Merck) is now spun onto the rear side RS and dried.

Figure 7:
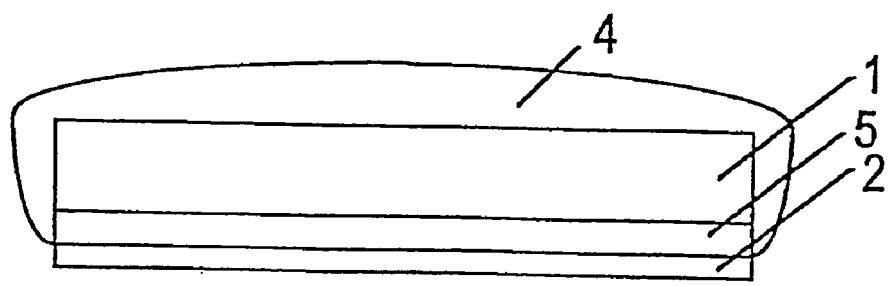

FIG. 7 shows the process step of BSF formation. The wafer prepared as per FIG. 6 is placed in a tray and treated in a pre-heated kiln at a temperature of 1000° C. to 1100° C. The kiln contains a pure oxygen atmosphere, which causes the immediate formation of an oxide layer 4 on all surfaces of the wafer 1 that are not covered by the boron doping layer 2.

At the same, time boron is expelled from the doping layer 2 and diffused into the rear side RS of the wafer 1. This causes the formation of an approximately 1–5 μm deep p+-doped area 5.

Figure 8:
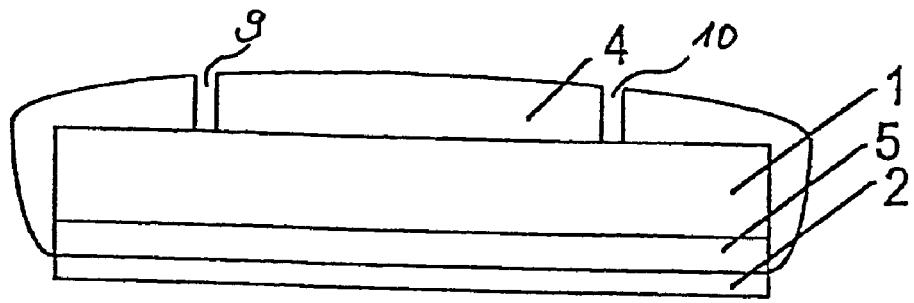

FIG. 8 shows the structuring of the oxide layer 4 with an etching paste, as per the screen printing process described above. Once the etching paste has been washed off, the structured areas 9 and 10 remain.

Figure 9:
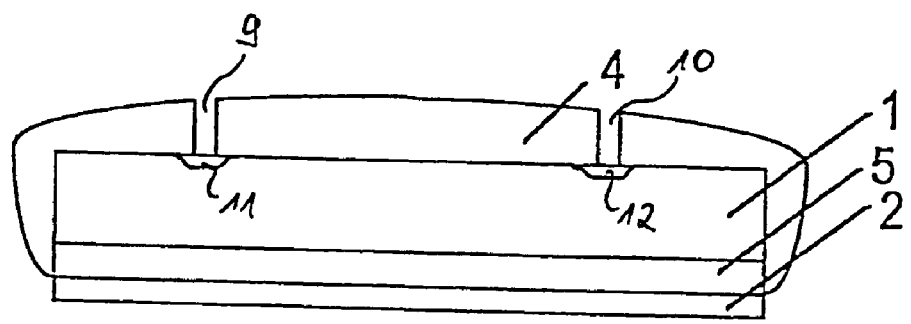

FIG. 9 shows the high n+-phosphorus-doping step used to form a selective emitter layer. The oxide layer 4 is used as a mask, to ensure that the high phosphorus-doping only forms in areas 11 and 12.

Figure 10:
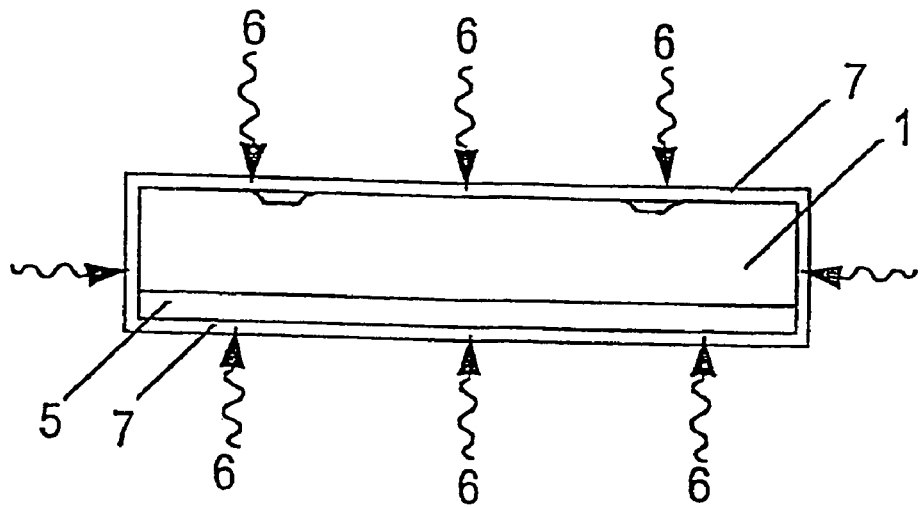

FIG. 10 shows the all-over weak phosphorus-doping of the solar cell after oxide layer 4 and doping finish 2 have been removed from the wafer. The diffusion of phosphorus (see arrow 6) is used to produce an all-round, flat n-doped surface area 7.

Figure 11:
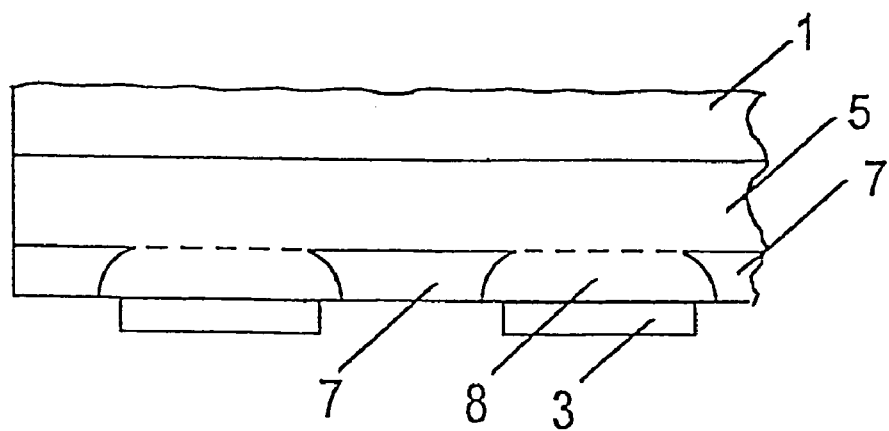

FIG. 11 shows the contacting on the rear side of the wafer. After separation by etching substance of the n-area 7 at the edge of the wafer (in a plasma, for example), a back contact 3 is attached. This is carried out, for example, by screen printing with a paste containing a binding agent and oxidic additives, along with conductive silver particles and 1% to 3% by weight of aluminium. When the printing process is complete, the back contact 3 is burnt in at a temperature of about 700° C. to 800° C. In this process, the aluminium doping material contained in the paste is driven into the rear side of the solar cell. With overcompensation of the n-doping, this ensures p+-doping in connection area 8 and thus a good ohmic contact between the p+ area 5 and the back contact 3.

In summary, the following steps are applied to the manufacture of a solar cell with selective emitter layer on the light-facing side and a back-surface-field on the rear side:

1. Preparation of a silicon wafer for processing: removal of the sections of surface damaged by cutting, followed by cleaning.
2. Applying the layer containing dopant to the silicon wafer, and indiffusion of the dopant into the silicon wafer (BSF production).
3. Production of a masking layer on the front side of the silicon wafer. The indiffusion of boron onto the rear side of the wafer is carried out in an oxidizing atmosphere. This causes an oxide layer to grow on the front of the wafer, which can then be used to produce the selective emitter structure.
4. Manufacture of a structure for the production of a selective emitter, by use of an etching paste.
5. Introducing the high degree of phosphorus-doping in the areas that are subsequently metallized with screen printing.
6. Removing the phosphorus-glass and oxide mask.
7. All-over weak phosphorus diffusion in the areas between the metal contacts.
8. Opening the n-conducting layer at the edge of the silicon wafer to provide electrical separation of the front and rear side of the solar cell.
9. Electrical passivation of the front of the solar cell for reduction of the surface recombination with oxide, Si-nitride or other passivating layers.
10. Contacting of the solar cell with silver screen-printing. On the front side of the solar cell, the silver metallizing must be adjusted precisely to the pattern of the high degree n+-doping of the silicon wafer.
11. Burning-in of the contact metallizing.

FIGS. 12–15 show the doping profiles of a solar cell, as produced on the front side (VS) and rear side (RS). In this case, the doping concentration is applied accordingly against the wafer thickness between the rear side RS and front side VS.

Figure 12:
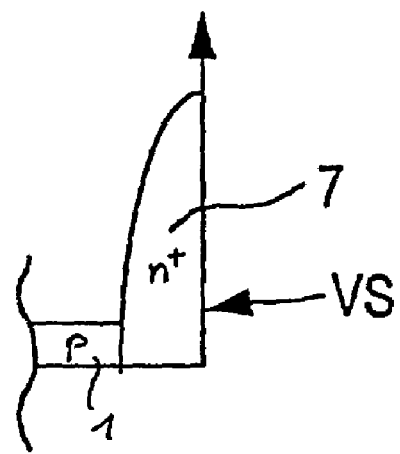
Figure 13:
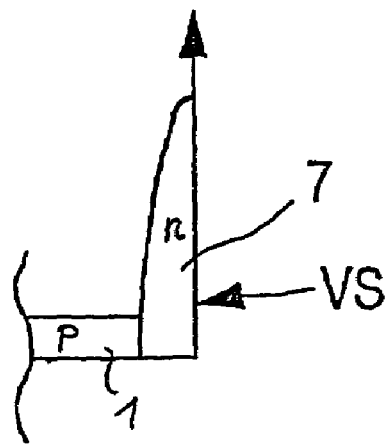

FIG. 12 shows the doping profile produced for the front side of the solar cell in areas of front-side contacting. Area 1 shows the uniformly low original p-doping of the wafer, while area 7 shows the high degree of phosphorus doping in areas of front-side contacting. FIG. 13, on the other hand, shows the doping profile produced in the other areas of the front side, which displays a low level of phosphorus doping in order to increase blue sensitivity.

FIG. 14 shows the doping profile produced on the rear side of the solar cell before burning-in of the back contact. Area 1 again shows the uniformly low original p-doping of the wafer. Area 5 shows the p+-doping, which is penetrated into the rear side RS of the wafer to an approximate depth of 5 μm. The uniform n-doping 7 with shallow penetration of approx. 0.2 μm, which is produced by phosphorus diffusion, forms the emitter on the front side and produces another n-doped area on the rear side by overcompensation of the p+-doping.

FIG. 15 shows the doping profile after burning-in of the back contact, where the back contact lies at the point of incision of the cross-section. The aluminium is used to overcompensate the n-doping of the rear side in the connection area, thus creating a consistent p+-doped area 8 underneath the back contact. A good resistive contact for the printed-on and burnt-in back contact of the solar cell is thus guaranteed.

FIG. 16 gives a schematic view of a finished solar cell. This shows at least one front-side contact 13, and an optional anti-reflection layer 14 on the front side, which can consist—for example—of an oxide or of silicon nitride. Under the anti-reflection layer 14, there is a passivation layer 15 consisting of a thin-layer oxide. The back contact 16 can be applied all over or, as an option, interrupted with an alternating rear passivation layer. These passivation layers can optionally be produced before the application of the front and/or back contact. As a result of the high degree of surface doping, an oxide forms especially fast, so that lower temperatures and short processing times are insufficient.

The selective emitter layer 17 is treated in the areas of the contact fingers 13 with an n+-doping and in other areas with uniform n-doping.

We claim:

1. A method for manufacturing a solar cell with a selective emitter layer, comprising the following steps:
    providing a p-doped semiconductor wafer having a surface, with a front side comprising a light-facing side, and a rear side;
    forming the selective emitter layer on the light-facing side by:
    applying an oxide layer on the light-facing side of the p-doped wafer;
    Structuring the oxide layer, using a screen printing process, wherein a squeegee paste containing an oxide-etching component is printed onto the oxide layer via a pattern stencil and the printed-on squeegee paste is removed again after a predetermined dwell time, to form structured areas;
    introducing a selective high degree of n-doping in the structured areas;
    removing the oxide layer;
    introducing weak n-doping, including over a large part of the surface of the wafer between the structured areas; and
    contacting of the light-facing side in areas of the selective high degree of n-doping.

2. The method according to claim 1, wherein the n-doping is introduced by means of phosphorus doping.

3. The method according to claim 2, wherein a phosphorus glass (POCl$_3$) formed during introducing the phosphorus doping is removed in a subsequent etching step.

4. The method according to claim 1, wherein the front side is contacted with a silver squeegee paste.

5. Use of a squeegee paste comprising a binding agent and an oxide-etching component in a method for manufacturing a solar cell with a selective emitter layer on the light-facing side according to claim 1.

6. A method for production of a solar cell with a selective emitter layer and a back-surface-field, comprising the following steps:
    providing a p-doped semiconductor wafer having a surface, with a front side comprising a light-facing side and a rear side, and an edge;
    forming the selective emitter layer on the light-facing side and the back-surface-field on the rear side by:
    applying to the rear side of the wafer a diffusion source layer containing boron as a dopant;
    treating the wafer in an oxygenous atmosphere at a temperature of 900° C. to 1200° C. to create an oxide layer and drive the dopant in;
    Structuring the oxide layer on the light-facing side of the wafer, using a screen printing process, wherein a squeegee paste containing an oxide-etching component is printed onto the oxide layer via a pattern stencil and the printed-on squeegee paste is removed again after a predetermined dwell time, to form structured areas;
    introducing a selective high degree of n-doping in the structured areas;
    removing the diffusion source layer and the oxide layer;
    introducing a weak n-doping, including over a large part of the surface of the wafer between the structured areas;
    contacting the light-facing side in areas of the selective high degree of n-doping; and
    applying a back contact to the rear side.

7. The method according to claim 6, wherein a boron-dopant coating or a boron-dopant paste is applied to act as the diffusion source layer.

8. The method according to claim 6, wherein the diffusion source layer and oxide layer are removed by etching with an HF solution.

9. The method according to claim 6, wherein the n-doping, is introduced by means of phosphorus doping.

10. The method according to claim 9, wherein a phosphorus glass (POCl$_3$) formed during introducing of the phosphorus doping is removed in a subsequent etching step.

11. The method according to claim 6, wherein the front side is contacted with a silver squeegee paste.

12. The method according to claim 6, wherein the rear side is contacted with a silver squeegee paste containing 1% to 3% by weight of aluminium.

13. The method according to claim 6, wherein the rear side is contacted in such a way that the boron doping is overcompensated by a flat n+-doping between the areas covered by the back contact.

14. The method according claim 6, wherein an anti-reflection layer is applied to the light-facing side and a passivation layer to the rear side.

15. Use of a squeegee paste comprising a binding agent and an oxide-etching component in a method for manufacturing a solar cell with a selective emitter layer on the light-facing side and a back surface field on the rear side according to claim 6.

16. The method according to claim 1 or 6, wherein the oxide-etching component consists of hydrofluoric acid (HF) and/or ammonium fluoride (NH$_4$F) and/or ammonium hydrogen fluoride (NH$_4$HF$_2$).

17. The method according to claim 1 or 6, wherein the oxide-etching component constitutes a proportion of 10% to 20% by volume of the squeegee paste.

18. The method according to claim 1 or 6, wherein the dwell time ranges from 30 seconds to 2 minutes.

19. The method according to claim 1 or 6, wherein the semiconductor wafer is a silicon wafer.

20. The method according to claim 1 or 6, wherein the light-facing side is contacted using the screen printing process.

21. The method according to claim 1 or 6, wherein the n-doping is depleted at the edge of the wafer after introducing the weak n-doping.

22. The method according claim 21, wherein the depleting of the n-doping at the edge of the wafer is carried out by etching of the edge.

23. The use according to claim 5 or 15, wherein the binding agent comprises wallpaper paste.

24. The use according to claim 5 or 15, wherein the binding agent consists of an epoxy resin.

25. The use according to claim 5 or 15, wherein the squeegee paste has a viscosity of between 10 and 500 Pa·s.

26. The use according to claim 5 or 15, wherein the oxide-etching component comprises hydrofluoric acid (HF) and/or ammonium fluoride (NH$_4$F) and/or ammonium hydrogen fluoride (NH4HF2) as the oxide-etching component.

27. The use according to claim 5 or 15, wherein the oxide-etching component constitutes a proportion of 10% to 20% by volume of the squeegee paste.

28. The use according to claim 5 or 15, wherein the squeegee paste has a viscosity of between 50 and 200 Pa·s.

* * * * *